United States Patent [19]

(12) United States Patent
Lu et al.

(10) Patent No.: US 10,211,561 B2
(45) Date of Patent: Feb. 19, 2019

(54) MINIATURE ELECTRONIC DEVICE

(71) Applicant: Feitian Technologies Co., Ltd., Beijing (CN)

(72) Inventors: Zhou Lu, Beijing (CN); Huazhang Yu, Beijing (CN)

(73) Assignee: Feitian Technologies Co., Ltd., Beijing (CN)

( * ) Notice: Subject to any disclaimer, the term of this patent is extended or adjusted under 35 U.S.C. 154(b) by 0 days.

(21) Appl. No.: 15/533,774

(22) PCT Filed: Dec. 25, 2015

(86) PCT No.: PCT/CN2015/099031
§ 371 (c)(1),
(2) Date: Jun. 7, 2017

(87) PCT Pub. No.: WO2017/075881
PCT Pub. Date: May 11, 2017

(65) Prior Publication Data
US 2018/0226741 A1 Aug. 9, 2018

(30) Foreign Application Priority Data
Nov. 2, 2015 (CN) .................... 2015 2 0862328 U

(51) Int. Cl.
| H01R 13/502 | (2006.01) |
| H01R 13/66 | (2006.01) |
| H01R 13/02 | (2006.01) |
| H05K 5/02 | (2006.01) |
| H05K 5/03 | (2006.01) |
| H05K 7/10 | (2006.01) |
| H01R 24/60 | (2011.01) |

(52) U.S. Cl.
CPC .......... *H01R 13/502* (2013.01); *H01R 13/02* (2013.01); *H01R 13/66* (2013.01); *H05K 5/0278* (2013.01); *H05K 5/03* (2013.01); *H05K 7/10* (2013.01); *H01R 24/60* (2013.01)

(58) Field of Classification Search
CPC ................................................ H01R 13/6658
See application file for complete search history.

(56) References Cited

U.S. PATENT DOCUMENTS 6,744,634 B2 *  6/2004  Yen ................... G06K 19/07732
                                                              361/752
6,994,568 B2 *  2/2006  Huang ................... H01R 13/50
                                                              235/492

(Continued)

*Primary Examiner* — Ross N Gushi
(74) *Attorney, Agent, or Firm* — Hammer & Associates, P.C.

(57) ABSTRACT

A micro electronic instrument, wherein said micro electronic instrument includes a baseboard and a cover board; a first electronic circuit and a first contact electrode are arranged on the baseboard, and the first electronic circuit connects the first contact electrode electrically; the cover board covers on the baseboard, but there is a space between them, and the first electronic circuit is in the space between the cover board and the baseboard. A width of the electronic instrument is in a range from 11.95 mm to 12.05 mm, a thickness of the electronic instrument is in a range from 2.4 mm to 2.5 mm. The electronic instrument provided in the present invention is smaller than that in prior art, and it is more portable and more convenient for a user.

15 Claims, 5 Drawing Sheets

(56) References Cited

U.S. PATENT DOCUMENTS

Figure 1:
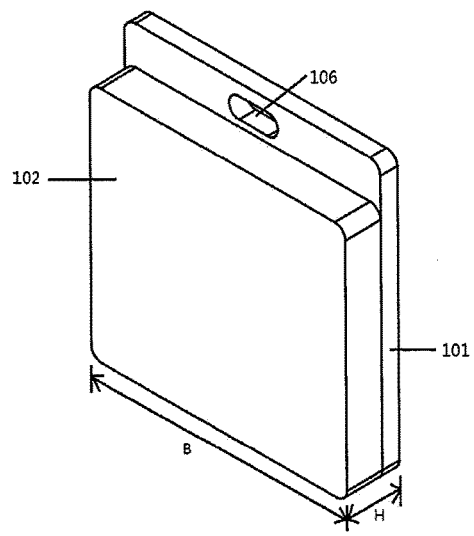

| | | | |
|---|---|---|---|
| 7,802,997 B2 * | 9/2010 | Kuo | H01R 13/6658 |
| | | | 361/737 |
| 2003/0028797 A1 * | 2/2003 | Long | G06F 21/32 |
| | | | 713/194 |
| 2003/0087554 A1 | 5/2003 | Huang | |
| 2008/0261449 A1 * | 10/2008 | Ni | H01R 13/453 |
| | | | 439/607.01 |

* cited by examiner

MINIATURE ELECTRONIC DEVICE

FIELD OF THE INVENTION

The present invention relates to a micro electronic instrument, on which a baseboard is at its socket part; and the instrument applies to some technological fields, such as communication, computer or electronic device. More particularly, the present invention relates to an electronic instrument with a USB junction.

PRIOR ART

In prior art, an electronic instrument with a USB junction is composed of a USB junction, an electronic circuit inside a shell and other functional areas on the shell, such as a key; thus the electronic instrument is usually large, and it is not convenient to take and store. Therefore, the electronic instrument in prior art cannot meet the customers' needs of more and more portable electronic instrument.

SUMMARY OF THE INVENTION

The present invention provides an electronic instrument, which includes a baseboard and a cover board, in addition, the electronic instrument further includes an electronic circuit and the electronic instrument is also a USB junction itself, thus the electronic instrument is smaller than before and it is more portable and more convenient for the users.

The present invention provides an electronic instrument, which includes a baseboard and a cover board;

there are a first electronic circuit and a first contact electrode on the baseboard, and the first electronic circuit connects the first contact electrode electrically;

the cover board covers on the baseboard, and there is provided a space for the first electronic circuit between the baseboard and the cover board.

Preferably, the baseboard is a printed-circuit board.

Preferably, when the electronic instrument inserts a USB interface, the first contact electrode connects to a corresponding electrode in the USB interface.

Preferably, the first electronic circuit and the first contact electrode are arranged on the front side and the back side of the baseboard respectively, and the cover board covers on the side of the baseboard on which the first electronic circuit is arranged.

Preferably, the manner of the cover board covering on the baseboard includes: fastening, bonding or engaging.

Preferably, a second contact electrode is arranged on the baseboard, and the second contact electrode connects the first electronic circuit electrically; the baseboard includes a first region and a second region, and the first region is in a USB interface and the second contact electrode is in the second region when the electronic instrument is inserted into the USB interface, and the second contact electrode is a touching key.

Preferably, the second contact electrode is on the side surface of the baseboard.

Preferably, the cover board is a printed-circuit board, a second electronic circuit is arranged on the cover board, the second electronic circuit connects to the first electronic circuit on the baseboard, and the second electronic circuit is in the space between the cover board and the baseboard.

Preferably, an anti-dismantle mechanism is also arranged between the baseboard and the cover board, the anti-dismantle mechanism connects to the baseboard and the cover board, and the anti-dismantle mechanism is in the space between the baseboard and the cover board.

Preferably, the baseboard has a first through hole, the cover board has a second through hole, and the second through hole is provided to communicate with the first through hole.

Preferably, there is also a supporting plate between the baseboard and the cover board, the supporting plate connects to the baseboard and the cover board; and the supporting plate is an annular supporting plate, and the space is between the baseboard, the cover board and the supporting plate.

Preferably, the supporting plate has a third through hole, and the third through hole is provided to communicate with the second through hole and the first through hole.

Preferably, a width of the electronic instrument is in a range from 11.95 mm to 12.05 mm, and a thickness of the electronic instrument is in a range from 2.4 mm to 2.5 mm.

Preferably, the width of the electronic instrument is 12 mm, and the thickness of the electronic instrument is 2.45 mm.

Preferably, the first contact electrode includes four electrodes which do not connect to each other, and the four electrodes are a first electrode, a second electrode, a third electrode and the fourth electrode.

Preferably, a width of each electrode included in the first contact electrode is in a range from 0.95 mm to 1.05 mm; a distance between the first electrode and the second electrode is in a range from 2.45 mm to 2.55 mm; and a distance between the second electrode and the third electrode is in a range from 1.95 mm to 2.05 mm; a distance between the third electrode and the fourth electrode is in a range from 2.45 mm to 2.55 mm.

Compared with the prior art, the present invention has following advantages:

the present invention provides an electronic instrument, which includes a baseboard and a cover board, the electronic circuit is arranged in the space between the cover board and the baseboard; and the electronic instrument is a USB junction itself, in this way, the electronic instrument is smaller than before and it is more portable and convenient.

BRIEF DESCRIPTION OF ACCOMPANYING DRAWINGS

Figure 2:
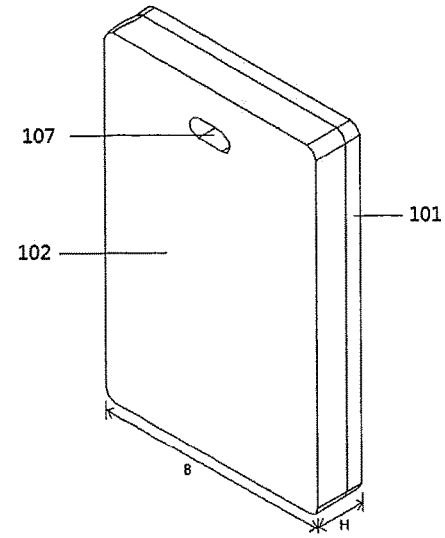
Figure 3:
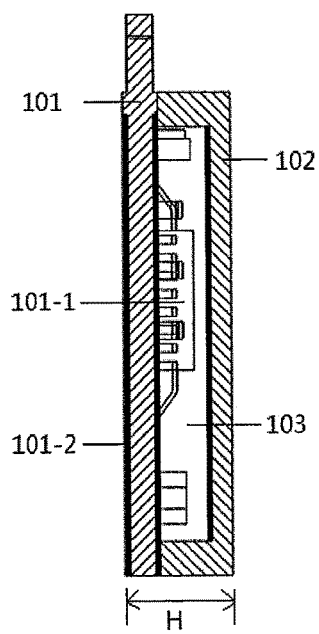
Figure 4:
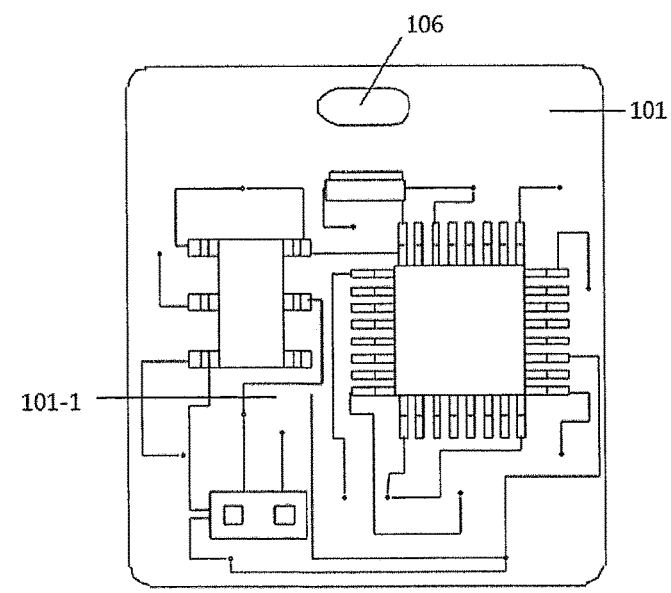
Figure 5:
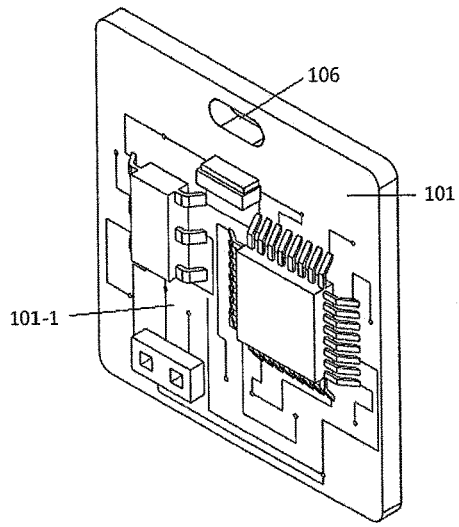
Figure 6:
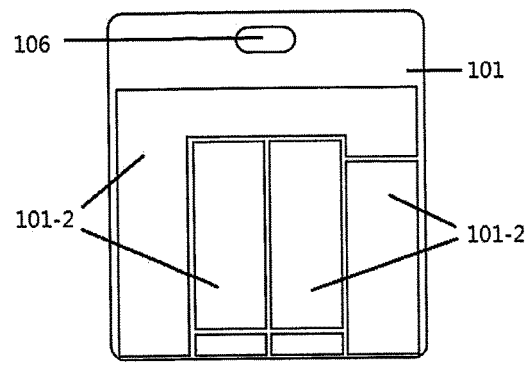
Figure 7:
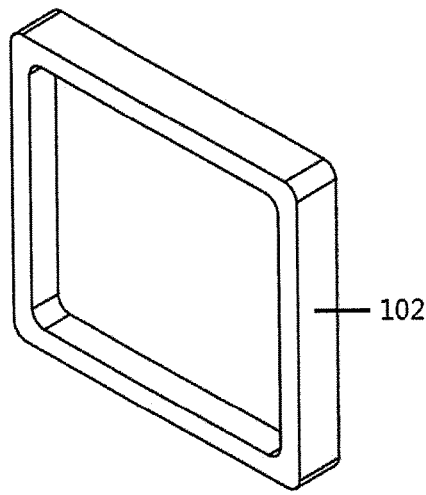
Figure 8:
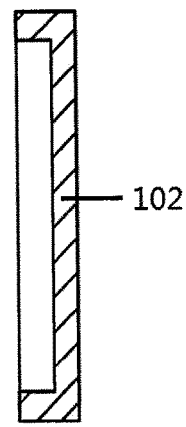
Figure 9:
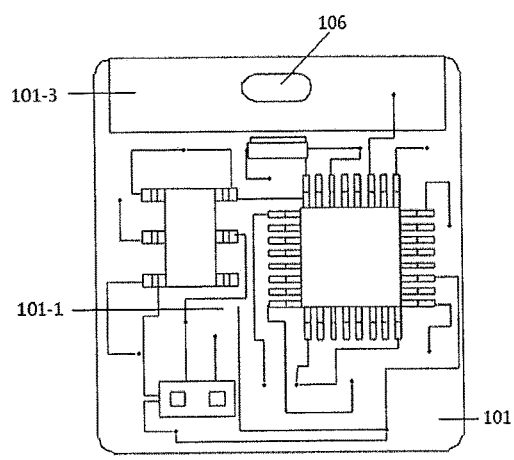
Figure 10:
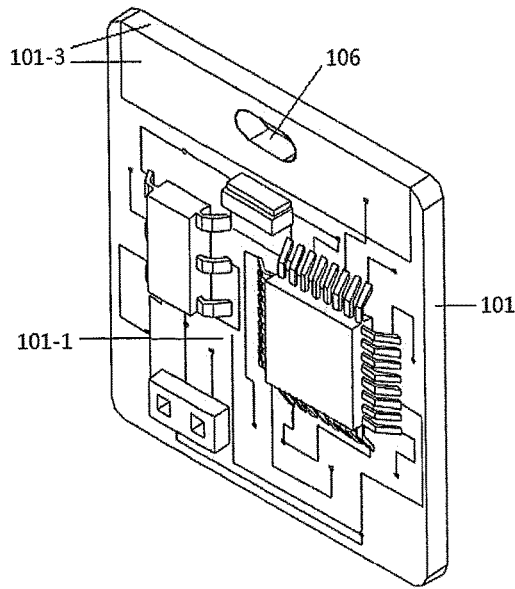
Figure 11:
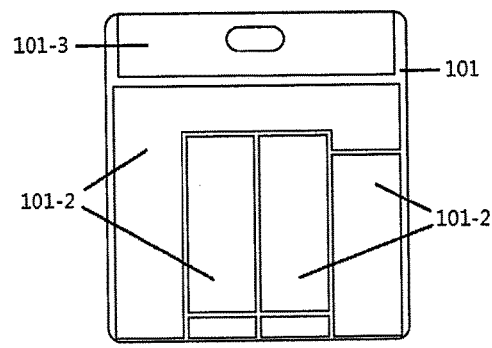
Figure 12:
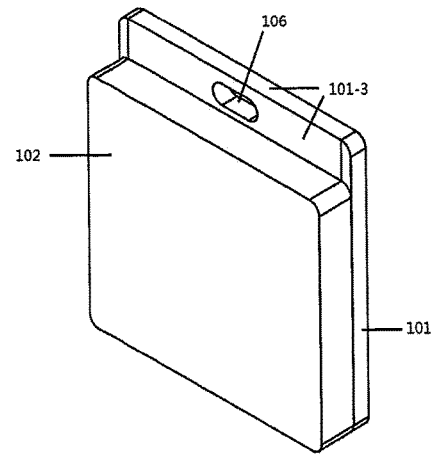
Figure 13:
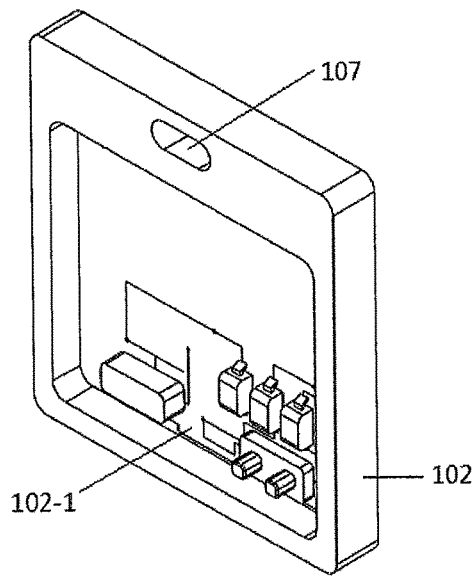
Figure 14:
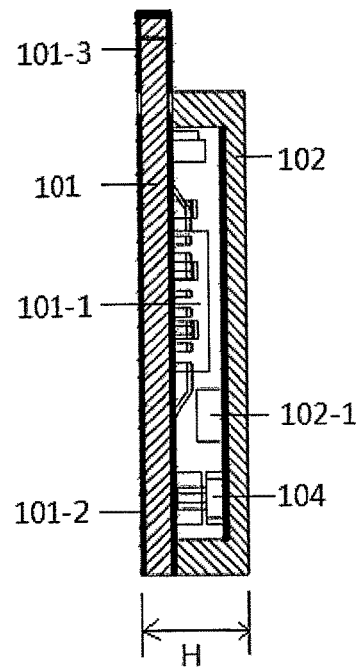
Figure 15:
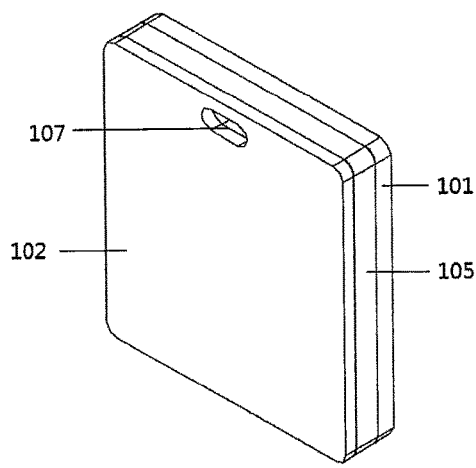
Figure 16:
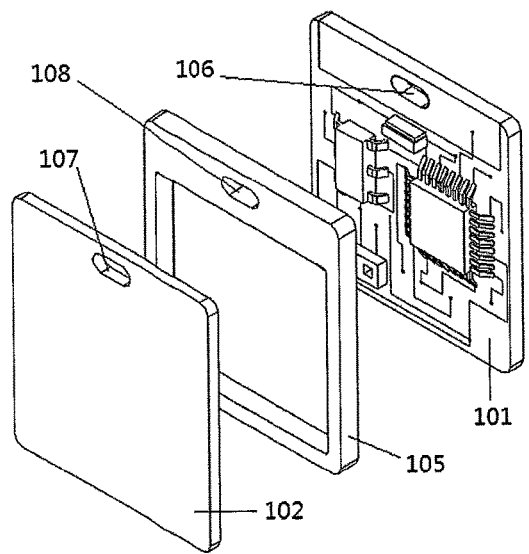
Figure 17:
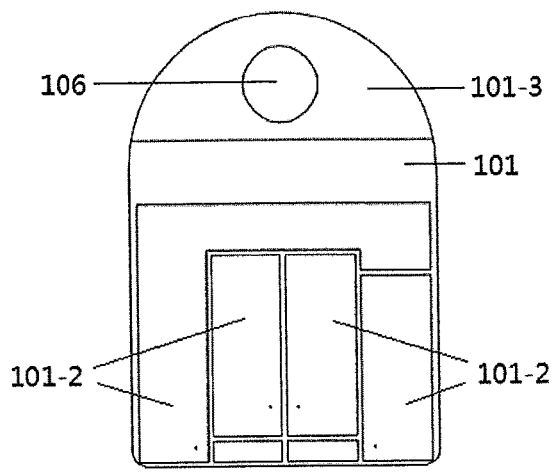
Figure 18:
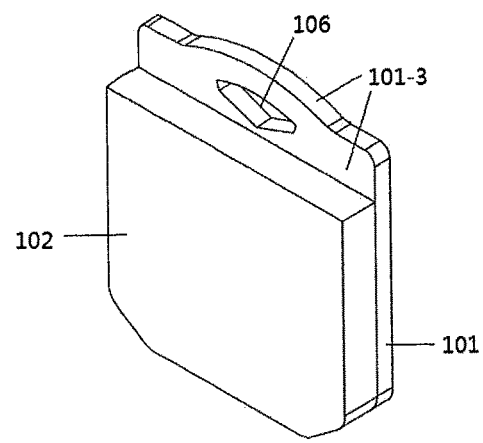
Figure 19:
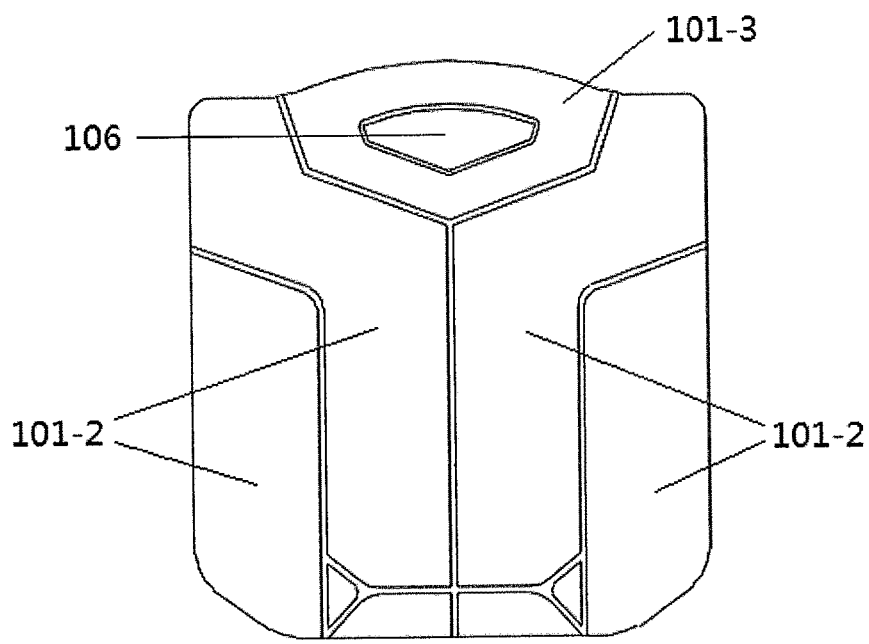

FIGS. 1-2 provide schematic diagrams of an electronic instrument according to an embodiment of the present invention;

FIG. 3 provides a profile chart of an electronic instrument according to the embodiment of the present invention;

FIGS. 4-6 provide schematic diagrams of the baseboard 101 of an electronic instrument according to the embodiment of the present invention;

FIGS. 7-8 provide schematic diagrams of the cover board 102 of an electronic instrument according to the embodiment of the present invention;

FIGS. 9-12 provide schematic diagrams of the second contact electrode 101-3 of the electronic instrument according to the embodiment of the present invention;

FIG. 13 provides a schematic diagram of baseboard 102 of the electronic instrument according to the embodiment of the present invention;

FIG. 14 provides a profile chart of an electronic instrument according to the embodiment of the present invention;

FIGS. 15-16 provide schematic diagrams of another of electronic instrument according to the embodiment of the present invention;

FIG. 17 provides a schematic diagram of another of electronic instrument according to the embodiment of the present invention; and FIGS. 18-19 provide a schematic diagram of another of electronic instrument according to the embodiment of the present invention.

DETAILED DESCRIPTION OF THE INVENTION

The technical solution in the Embodiment of the present invention is further described more clearly and completely with the drawings of the present invention. Apparently, Embodiments described herein are just a few Embodiments of the present invention. On the basis of Embodiments of the invention, all other related Embodiments made by those skilled in the art without any inventive work belong to the scope of the invention.

The present invention provides an electronic instrument, as shown in FIGS. 1-3, which includes a baseboard 101 and a cover board 102;

a first electronic circuit 101-1 and a first contact electrode 101-2 are arranged on the baseboard 101, and the first electronic circuit 101-1 connects to the first contact electrode 101-2 electrically;

Preferably, the baseboard is a PCB which is specifically Printed Circuit Board; and the first contact electrode 101-2 connects to a corresponding electrode in a USB interface when the electronic instrument is inserted into the USB interface;

Preferably, the first contact electrode 101-2 includes four electrodes which do not connect to each other, and the four electrode are a first electrode, a second electrode, a third electrode and a four electrode; a width of each electrode is in a range from 0.95 mm to 1.05 mm; a distance between the first electrode and the second electrode, which is a distance between a median of the first electrode along inserting into the USB interface direction and a median of the second electrode along inserting into the USB interface direction, is in a range from 2.45 mm to 2.55 mm; a distance between a second electrode and the third electrode, which is a distance between the median of the second electrode along inserting into the USB interface direction and a median of the third electrode along inserting into the USB interface direction, is in a range from 1.95 mm to 2.05 mm; a distance between the third electrode and the fourth electrode, which is specifically a distance between the median of the third electrode along inserting into the USB interface direction and a median of the fourth electrode along inserting into the USB interface direction, is in a range from 2.45 mm to 2.55 mm; both of a length of first electrode and a length of the fourth electrode are in a range from 7.10 mm to 7.72 mm, both of a length of the second electrode and a length of the third electrode are in a range from 6.10 mm to 6.72 mm;

The cover board 102 covers on the baseboard 101, a space 103 is between the cover board 102 and the baseboard 101, and the first electronic circuit 101-1 on the baseboard 101 is in the space 103, as shown in FIG. 3;

Preferably, as shown in FIGS. 4-6, the first electronic circuit 101-1 is arranged on one side of the baseboard 101, and the first contact electrode 101-2 is arranged on the other side, that is to say, the first electronic circuit 101-1 and the first contact electrode 101-2 are on the front side and the back side of the baseboard 101 respectively; the cover board 102 covers on the side on which the first electronic circuit 101-1 is arranged, and the cover board 102 is shown in FIG. 7 and FIG. 8;

In the present Embodiment, the cover board 102 covers on the baseboard 101, the manner of covering includes but not limit to fastening, bonding or engaging;

Preferably, as shown in FIGS. 9-12, a second contact electrode 101-3 is also arranged on the baseboard 101, which connects to the first electronic circuit 101-1 electrically; the baseboard 101 includes a first region and a second region, when the electronic instrument is inserted into a USB interface, the first region is in the USB interface, and the second contact electrode 101-3 is in the second region of the electronic instrument, the second contact electrode 101-3 can be a touching key; when the electronic instrument is inserted into the USB interface, the second contact electrode 101-3 is outside the USB interface;

For instance, the second contact electrode 101-3 is on the side face of the baseboard 101; the first region can include the first electronic circuit 101-1 and the first contact electrode 101-2;

Preferably, the cover board 102 is a PCB which specifically is Printed Circuit Board, a second electronic circuit 102-1 is arranged on one side of the cover board 102, which connects to the first electronic circuit 101-1, the second electronic circuit 102-1 is in the space 103 between the cover board 102 and the baseboard 101, as shown in FIG. 13 and FIG. 14;

Besides, an anti-dismantle mechanism 104 is also arranged in the space between the cover board 102 and the baseboard 101, which connects to the baseboard 101 and the cover board 102, and the anti-dismantle mechanism 104 is in the space 103 between the cover board 102 and the baseboard 101, as shown in FIG. 14;

Besides, a supporting plate 105 is between the baseboard 101 and the cover board 102, and the supporting plate 105 connects to the baseboard 101 and the cover board 102; the supporting plate 105 is an annular supporting plate, and the space 103 is among the supporting plate 105, the baseboard 101 and the cover board 102 as shown in FIG. 15 and FIG. 16;

Beyond that, the baseboard 101 has a first through hole 106 which can be configured to hang a rope;

Preferably, the first through hole 106 is on the edge of the baseboard 101;

In addition, the cover board 102 has a second through hole 107 which is provided to communicate with the first through hole 106; and the through holes can be configured to hang a rope;

Besides, the supporting plate 105 has a third through hole 108 which is provided to communicate with the second through hole 107 or the first through hole 106; the third through hole 108, the second through hole 107 and the first through hole 106 can be configured to hang a rope;

Besides, the shape of the first contact electrode 101-2 and the shape of the second contact electrode 101-3 on the baseboard 101 and the cover board 102 are not limited to the shapes given in the figures as shown in FIGS. 17-19;

In the present embodiment, the width B of the electronic instrument composed of the baseboard 101 and the cover board 102 is in a range from 11.95 mm to 12.05 mm; the thickness H of the electronic instrument composed of the baseboard 101 and the cover board 102 is in a range from 2.4 mm and the 2.5 mm;

For instance, the width B of the electronic instrument composed of the baseboard 101 and the cover board 102 is 12 mm, and the thickness H of the electronic instrument composed of the baseboard 101 and the cover board 102 is 2.45 mm.

The present invention provides an electronic instrument which includes the baseboard 101 and the cover board 102; the said electronic instrument is also a USB junction and includes the electronic circuit, thus the said electronic instrument is smaller than before; moreover, the second contact electrode 101-3, which can be a touching key, is arranged on the baseboard 101, the cover board 102 can be the PCB and the second electronic circuit 102-1 is arranged on the cover board 102, that increases function of the electronic instrument; the anti-dismantle mechanism 104 can also be arranged on the cover board 102, that makes the electronic instrument safer; the electronic instrument can further include the through hole 106 which is in the baseboard 101 and/or the cover board 102; the through hole 106 can be configured to hang a rope, that makes the electronic instrument more portable. Thus, the electronic instrument provided in the present invention is smaller, more portable and more convenient for a user.

The Embodiment described herein is just a preferable Embodiment of the present invention. On the basis of the Embodiment of the invention, all other related Embodiments made by those skilled in the art without any inventive work belong to the scope of the invention.

The invention claimed is:

1. A micro electronic instrument, wherein said micro electronic instrument comprises a baseboard and a cover board;
   a first electronic circuit and a first contact electrode are arranged on the baseboard, and the first electronic circuit is provided to connect the first contact electrode electrically;
   the cover board is provided to cover on the baseboard, and there is arranged a space for the first electronic circuit between the baseboard and the cover board;
   the first electronic circuit and the first contact electrode are arranged on the front side and the back side of the baseboard respectively, and the cover board covers on the side of the baseboard on which the first electronic circuit is arranged;
   a second contact electrode is arranged on the baseboard, and the second contact electrode connects the first electronic circuit electrically;
   the baseboard includes a first region and a second region, and the first region is in a USB interface and the second contact electrode is in the second region when the electronic instrument is inserted into the USB interface; and
   the baseboard has a first through hole.

2. The electronic instrument as claimed in claim 1, wherein the baseboard is a printed-circuit board.

3. The electronic instrument as claimed in claim 1, wherein when the electronic instrument is inserted into a USB interface, the first contact electrode connects to a corresponding electrode in the USB interface.

4. The electronic instrument as claimed in claim 1, wherein the manner of the cover board covering on the baseboard comprises: fastening, bonding or engaging.

5. The electronic instrument as claimed in claim 1, wherein the second contact electrode is a touching button.

6. The electronic instrument as claimed in claim 1, wherein the second contact electrode is on the side surface of the baseboard.

7. The electronic instrument as claimed in claim 1, wherein a second electronic circuit is arranged on the cover board, the second electronic circuit connects to the first electronic circuit, and the second electronic circuit is arranged in the space between the cover board and the baseboard.

8. The electronic instrument as claimed in claim 1, wherein an anti-dismantle mechanism is also arranged between the baseboard and the cover board, the anti-dismantle mechanism connects to the baseboard and the cover board, and the anti-dismantle mechanism is arranged in the space between the baseboard and the cover board.

9. The electronic instrument as claimed in claim 1, wherein the cover board has a second through hole, and the second through hole is provided to communicate with the first through hole.

10. The electronic instrument as claimed in claim 9, wherein a supporting plate is also arranged between the baseboard and the cover board, the supporting plate connects to the baseboard and the cover board; the supporting plate is an annular supporting plate, and the space is enclosed by the baseboard, the cover board and the supporting plate.

11. The electronic instrument as claimed in claim 10, wherein the supporting plate has a third through hole, and the third through hole is provided to communicate with the second through hole or the first through hole.

12. The electronic instrument as claimed in claim 1, wherein a width of the electronic instrument is in a range from 11.95 mm to 12.05 mm, and a thickness of the electronic instrument is in a range from 2.4 mm to 2.5 mm.

13. The electronic instrument as claimed in claim 12, wherein the width of the electronic instrument is 12 mm, and the thickness of the electronic instrument is 2.45 mm.

14. The electronic instrument as claimed in claim 1, wherein the first contact electrode comprises four electrodes which do not connect to each other, and the four electrodes are a first electrode, a second electrode, a third electrode and the fourth electrode.

15. The electronic instrument as claimed in claim 14, wherein a width of each electrode of the first contact electrode is in a range from 0.95 mm to 1.05 mm; a distance between the first electrode and the second electrode is in a range from 2.45 mm to 2.55 mm; and a distance between the second electrode and the third electrode is in a range from 1.95 mm to 2.05 mm; a distance between the third electrode and the fourth electrode is in a range from 2.45 mm to 2.55 mm.

* * * * *